United States Patent [19]
Fujisaki

[11] Patent Number: 4,958,345
[45] Date of Patent: Sep. 18, 1990

[54] MEMORY TESTING DEVICE
[75] Inventor: Kenichi Fujisaki, Gyoda, Japan
[73] Assignee: Advantest Corporation, Tokyo, Japan
[21] Appl. No.: 287,139
[22] Filed: Dec. 21, 1988
[30] Foreign Application Priority Data
   Dec. 29, 1987 [JP] Japan ................. 62-335812
[51] Int. Cl.5 .......................................... G06F 11/00
[52] U.S. Cl. ............................. 371/21.3; 371/25.1;
                                                        371/27
[58] Field of Search .............. 371/21.2, 21.3, 21.1,
        371/25.1, 27; 365/201; 358/10, 139, 314, 327;
                                                       364/521

[56]         References Cited
        U.S. PATENT DOCUMENTS

| 4,369,511 | 1/1983 | Kimura | 371/21.2 |
|---|---|---|---|
| 4,370,746 | 1/1983 | Jones | 371/21.1 X |
| 4,742,474 | 5/1988 | Knierim | 364/521 |
| 4,775,857 | 10/1988 | Staggs | 371/21.2 X |
| 4,788,684 | 11/1988 | Kawaguchi | 371/21.2 |
| 4,807,229 | 2/1989 | Tada | 371/27 |
| 4,835,774 | 5/1989 | Ooshima | 371/21.2 |

Primary Examiner—Jerry Smith
Assistant Examiner—Robert W. Beausoliel
Attorney, Agent, or Firm—Staas & Halsey

[57] ABSTRACT

In a memory testing device for testing a memory capable of effecting a write and a read in pixel, plane and block modes, there are provided a pattern generator for generating an address and data for supply to the memory under test and a buffer memory which has memory chips equal in number to the square of the number of bits of the data. The same data as that to be written in the memory under test is written in the buffer memory in the same mode as in the memory under test, and the data is read out in the same mode as in the memory under test. The data thus read out of the buffer memory is used as expected value data for logical comparison with data read out of the memory under test.

15 Claims, 12 Drawing Sheets

MEMORY TESTING DEVICE

BACKGROUND OF THE INVENTION

The present invention relates to a device for testing memories which are used to store images, for instance.

In general, a semiconductor memory testing device has such an arrangement as shown in FIG. 1. An address signal is applied to a memory under test 200 from an address terminal 101 of a pattern generator 100 and data created by the pattern generator 100 at that time is provided from its data terminal 102 to the memory 200 and written therein at the specified address. Then, an address signal is applied from the pattern generator 100 to the memory 200 to read out therefrom the stored data. The thus read-out data and data output from the pattern generator 100, that is, expected value data, are compared by a logic comparator 300 to determine whether the memory under test 200 is good or bad.

The pattern generator 100 is made up of an address generator 103, a data generator 104, a data memory 105, a clock control signal generator 106, and a sequence controller 107. The sequence controller 107 controls the address generator 103, the data generator 104, and the clock control signal generator 106. The address generator 103 generates an address signal which is applied to the memory under test 200. The data generator 104 generates, by a logical operation, data for input into the memory 200, that is, write data, and expected value data for input into the logical comparator 300. The data memory 105 also generates data for input into the memory 200 and expected value data for input into the logical comparator 300 which are prestored in the memory 105.

The data generator 104 is used to generate regular data and the data memory 105 to generate irregular, random data. A multiplexer 108 switches between the data generator 104 and the data memory 105. The clock control signal generator 106 generates a clock control signal which is applied to the memory under test 200.

The conventional semiconductor memory testing device shown in FIG. 1 cannot test image memories recently developed. The image memories are each provided with a random access port and a serial access port. The memory is randomly accessed through the random access port. Through the serial access port an initial address is set and is then incremented one by one at high speed in response to a clock, for sequential access to respective memory addresses. A device for testing such a dual port type memory has been proposed in Japanese Patent Application Kokai No. 269076/87, "Semiconductor Memory Testing Device", laid open on Nov. 21, 1987.

There have also been proposed image memories which operate in pixel, plane and block modes. In the case of an image memory for color display, a total of four bits for three color information R, G and B and control information C are employed as minimum pixel information PIX as shown in FIG. 2. The pixel information PIX may sometimes be made eight bits long so as to increase the number of colors used for display. As shown in FIG. 2, the pixel information PIX of an arbitrary address is accessed using an N+1 bits long address signal ($A_0 \ldots A_N$) and sequentially stored in a memory in the depthwise direction of the address. By sequentially or randomly reading out the address in the direction of its depth, the pixel information PIX can be read out or written. This read/write mode is called a pixel mode.

In the plane mode only a single-color information line is accessed by the same number of bits as that of the pixel information PIX.

According to the plane mode, single-color information can be re-written and read out in units of four bits, and a desired area of the display screen can be painted over with the color at high speed. The four-bit signal for effecting the re-write and the read-out at one time will hereinafter be referred to as plane information PLN.

In the block mode a memory space of, for example, a four-by-four bit plane can be read and written at one time. This mode is used for clearing, at high speed, a limited area of the display screen, for example, a multi-window.

Since the dual port type image memory has such various functions as mentioned above, it is difficult for the testing device to create expected value data for testing such functions. It is difficult, in particular, to produce expected value data necessary for reading out, in the plane or block mode, data written in the pixel mode, or for reading out, in the pixel or block mode, data written in the plane mode.

In the testing of a memory capable of inhibiting a write for each bit of data, test data is written into an uninhibited bit but previous data is held in an inhibited bit. The expected value data is therefore determined by previous data, data to be written, and mask data which determines the bit to be inhibited, and consequently, the number of their combinations is large, making it more and more difficult to generate the expected value data.

In the testing of a memory which possesses a logical operation function, it is necessary to determine the expected value data according to data to be applied from a pattern generator, data already written in the memory under test, and the kind of logical operation which is performed in the memory. Also in this instance, the generation of the expected value data is difficult.

SUMMARY OF THE INVENTION

It is therefore an object of the present invention to provide a memory testing device which permits testing of memories which have a variety of functions.

According to an aspect of the present invention, a memory testing device for testing a memory capable of effecting a read and a write in the pixel, plane and block modes includes: a buffer memory which is formed by memory chips equal in number to the square of the number of bits of data to be written into and read out of each address of a memory under test and which is arranged so that a desired one of the memory chips is selected by a chip select signal for access thereto, thereby effecting a write and a read in the pixel, plane or block mode equivalent to that used in the memory under test; means whereby data identical with that to be written into the memory under test is written into the buffer memory in the same mode as that used in the memory under test and the data thus written is read out of the buffer memory in the same mode as that used in the memory under test; and a logical comparator which uses the read-out signal from the buffer memory as an expected value signal and makes a logical comparison between it and the read-out output from the memory under test, thereby determining whether the memory under test is good or bad.

The memory testing device described above is provided with the buffer memory which operates equally to the memory under test. That is, when the memory under test operates in the pixel, plane or block mode, the buffer memory also operates in the same mode as does the memory under test, and when data is read out of the memory under test, the buffer memory is also read in the same mode.

Thus, the data that is read out of the buffer memory can be utilized as expected value data, and consequently, memories of complex operations can be tested with a relatively simple arrangement.

According to another aspect of the present invention, a memory testing device for testing a memory capable of effecting a write and a read in the pixel, plane and block modes, making a logical operation of input data bit by bit and writing the result of the logical operation, includes: a buffer memory which is formed by memory chips equal in number to the square of the number of bits of data to be written into and read out of each address of the memory under test and which is arranged so that a desired one of the memory chips is selected by a chip select signal for access thereto so as to effect a write and a read in the pixel, plane or block mode equivalent to that used in the memory under test; logical operation means which processes input data bit by bit and writes the result of processing into the buffer memory; and a logical comparator by which data identical with that to be written into the memory under test is written into the buffer memory in the same mode and the data thus written is read out in the same mode as in the memory under test and which employs the read-out signal as expected value data and compares it and the read-out signal of the memory under test.

The memory testing device described above is provided with the buffer memory which operates equally to the memory under test. That is, when the memory under test operates in the pixel, plane or block mode, the buffer memory also operates in the same mode as does the memory under test, and when data is read out of the memory under test, the buffer memory is also read in the same mode.

Thus, the data that is read out of the buffer memory can be utilized as expected value data, and consequently, memories of complex operations can be tested with a relatively simple arrangement.

Besides, since the buffer memory is provided with the logical operation means equivalent to that built in the memory under test, a write can be effected in the buffer memory by the same processing as that in the memory under test.

Consequently, even if the operating function is worked in the memory under test, it is possible to store in the buffer memory the result of the same processing as in the memory under test.

Thus, even if the operating function is activated, data which is read out of the memory under test in each mode can be utilized as expected value data.

DESCRIPTION OF THE PREFERRED EMBODIMENTS

Figure 1:
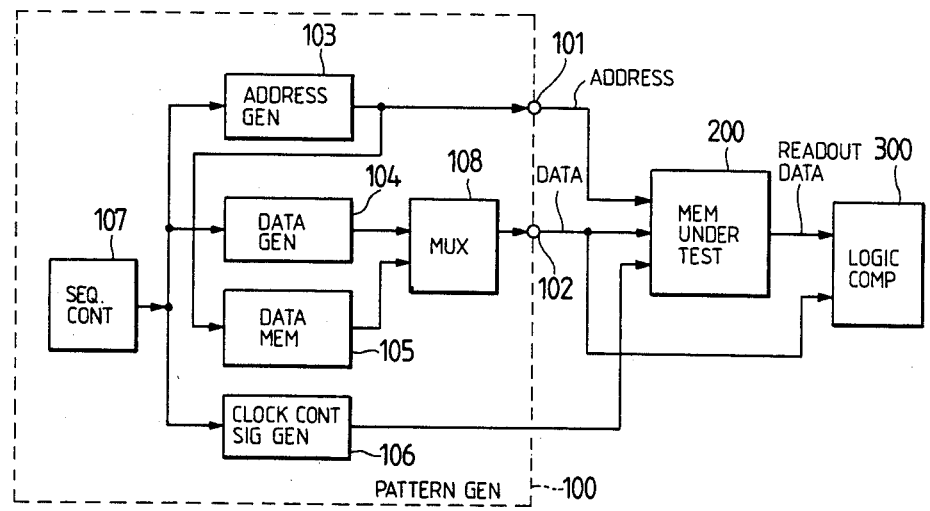
FIG. 1 is a block diagram, for explaining the prior art.
Figure 3:
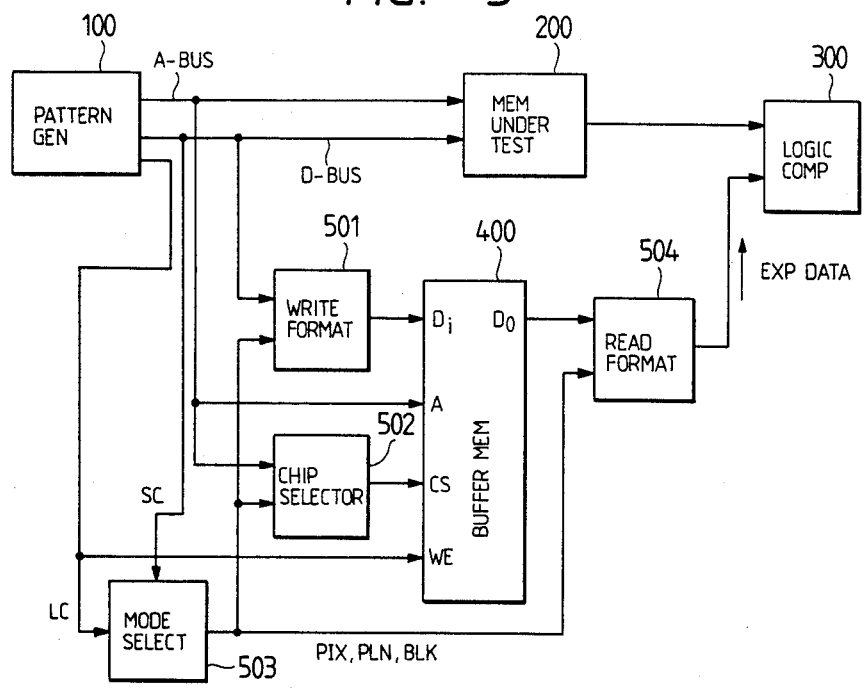
FIG. 3 is a block diagram, for explaining the general arrangement of the present invention.

FIG. 3 illustrates the general constitution of the present invention. In FIG. 3, the parts corresponding to those in FIG. 1 are identified by the same reference numerals.

The basic constitution of the present invention resides in that expected value data for application to the logical comparator 300 is read out of a buffer memory 400. The buffer memory 400 is formed by memory chips equal in number to the square, $W^2$, of the number of bits (i.e. the data width), W, of data which is written into and read out of each address of the memory under test 200. In general, the above-mentioned number of bits, W, is selected so that $W=2^m$ (where m is an integer greater than unity). The memory chips are selected by a chip selector 502, by which a read and a write can be effected in the pixel, plane or block mode equivalent to that used in the memory under test 200. When supplied with a load command LC from the pattern generator 100, a mode selector 503 loads and decodes a mode select code SC provided on a data bus D-BUS from the pattern generator 100 at that time and yields a pixel mode signal PIX, a plane mode signal PLN, or a block mode signal BLK. In accordance with this mode signal a write formatter 501, the chip selector 502 and a read formatter 504 are set to the mode thus selected.

Figure 4:
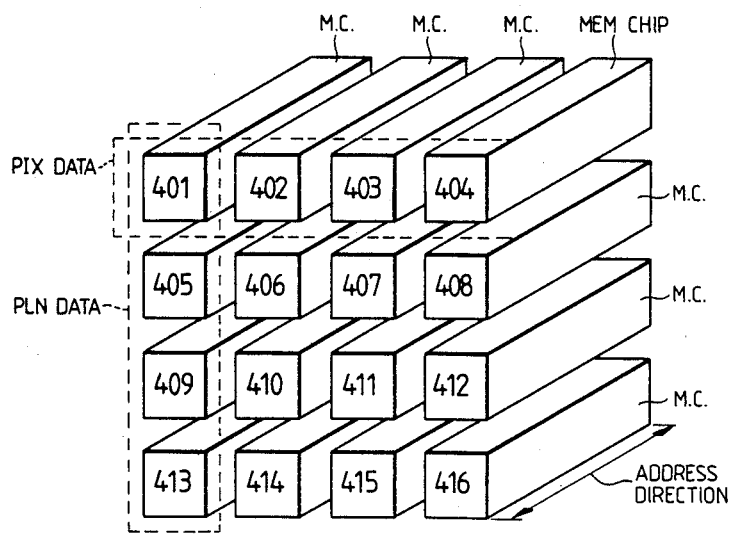
FIG. 4 is an imaginary solid diagram, for explaining an example of the internal structure of the buffer memory for use in the present invention.

In this example the buffer memory 400 is made up of $W^2=16$ (i.e. W=4 and m=2) memory chips 401 to 416 as shown in FIG. 4. The memory chips 401 to 416 may each be a memory chip of $1 \times 64$ K or $1 \times 256$ K bits, for example, and the response speed of this memory chip is sufficiently higher than the response speed of the memory under test 200. Each of the 16 memory chips 401 to 416 has its address input terminals, except m bits, i.e. low-order two bits, connected in common to address input terminals of the memory under test 200 and is supplied with an address signal identical with that which is applied to the memory under test 200. Address signals $A_0$ and $A_1$ of the low-order two bits in the address signal are provided to the chip selector 502, wherein a chip select signal is produced.

Figure 5:
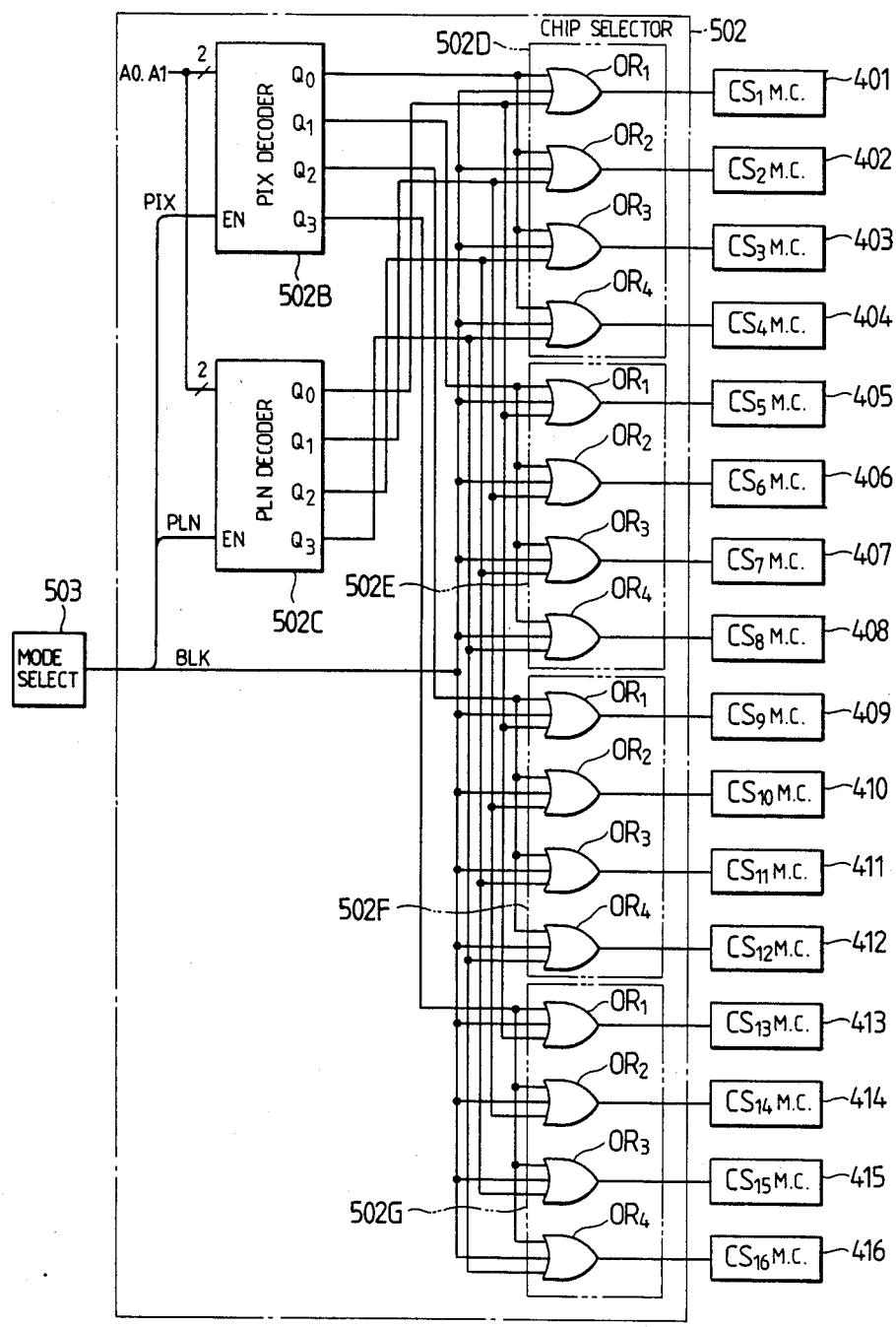
FIG. 5 is a connection diagram, for explaining an example of a chip selector for use in the present invention.

The chip selector 502 can be formed by, for instance, two decoders 502B and 502C and four OR gate groups 502D, 502E, 502F and 502G as shown in FIG. 5. The OR gate groups 502D, 502E, 502F and 502G are each composed of four OR gates $OR_1$, $OR_2$, $OR_3$ and $OR_4$, which have their output terminals connected to chip select terminals $CS_1$ to $CS_{16}$ of the memory chips 401 to 416 forming the buffer memory 400.

The mode select signals PIX, PLN and BLK from the mode selector 503 are each applied as an H-logic signal to enable terminals EN of the decoders 502B and 502C. The decoders 502B and 502C are each supplied at an input terminal with the signals $A_0$ and $A_1$ of the low-order two bits of the address signal and, when supplied at the enable terminal EN with the H-logic signal, each sequentially provides at output terminals $Q_0$, $Q_1$, $Q_2$ and $Q_3$ H-logic signals corresponding to the values of the signals $A_0$ and $A_1$. That is to say, in the pixel mode the decoder 502B is supplied at its enable terminal EN with the H-logic mode select signal PIX and, in this state, provides at the output terminals $Q_0$ to $Q_3$ H-logic signals corresponding to the values of the address signals $A_0$ and $A_1$. The decoder 502B will hereinafter be referred to as the pixel decoder. The H-logic signals output from the pixel decoder 502B are applied to the OR gate groups 502D, 502E, 502F and 502G, respectively. In other words, the OR gates $OR_1$ to $OR_4$ of each of the OR gate groups 502D to 502G are connected together at one input terminal and the output terminals $Q_0$ to $Q_3$ of the pixel decoder 502D are connected to the thus connected input terminals of the OR gate groups, respectively.

In the plane mode the decoder 502C is supplied at its enable terminal EN with the H-logic mode select signal PLN from the mode selector 503 and, in this state, sequentially provides at the output terminals $Q_0$ to $Q_3$ H-logic signals corresponding to the values of the address signals $A_0$ and $A_1$. The decoder 502C will hereinafter be referred to as the plane decoder. The corresponding OR gates of the OR gate groups 502D to 502G are connected together at another input terminal and the output terminals $Q_0$ to $Q_3$ of the plane decoder 502C are connected to thus interconnected input terminals, respectively.

The OR gates of the OR gate groups 502D to 502G are all connected together at yet another input terminal, and in the block mode the H-logic mode select signal BLK is applied from the mode selector 503 to the input terminals thus interconnected.

With such an arrangement, the pixel decoder 502B is enabled in the pixel mode and provides H-logic signals at the output terminals $Q_0$ to $Q_3$ in accordance with the values of the signals $A_0$ and $A_1$ of the low-order two bits of the address signal which is applied to the input terminal. Assume that the address signals $A_0$ and $A_1$ vary step by step in the order of "0, 0", "1, 0", "0, 1", "1, 1", "0, 0", "1, 0", . . . . When the address signals $A_0$ and $A_1$ are "0, 0", the pixel decoder 502B yields an H-logic signal at the output terminal $Q_0$ and applies it to all the OR gates $OR_1$ to $OR_4$ of the OR gate group 502D, and consequently, these OR gate $OR_1$ to $OR_4$ all output H-logic signals, selecting memory chips 401 to 404.

When the address signals $A_0$ and $A_1$ step to "1, 0", the pixel decoder 502B provides an H-logic signal via the output terminal $Q_1$ to the OR gates $OR_1$ to $OR_4$ of the OR gate group 502E. As a result of this, the memory chips 405 to 408 are selected. When the address signals $A_0$ and $A_1$ step to "0, 1", the pixel decoder 502B applies an H-logic signal via the output terminal $Q_2$ to the OR gates $OR_1$ to $OR_4$ of the OR gate group 502F, from which H-logic signals are provided to the chip select terminals CS of the memory chips 409 to 412 to select them. When the address signals step to "1, 1", the pixel decoder 502B applies an H-logic signal via the output terminal $Q_3$ to the OR gates $OR_1$ to $OR_4$ of the OR gate group 502G, and consequently, the memory chips 412 to 416 are selected.

Figure 2:
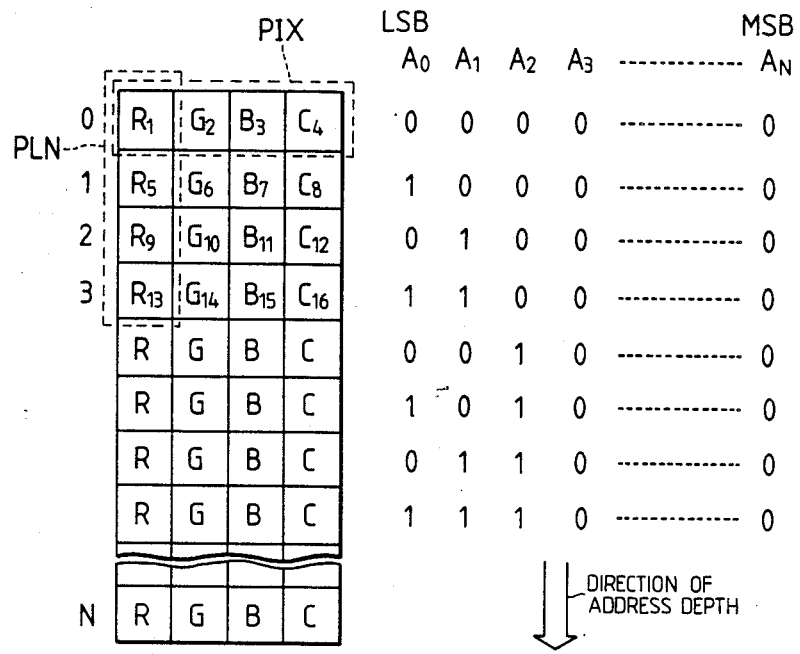
FIG. 2 is a diagram, for explaining the internal structure of an image memory.

Thus, in the pixel mode, a memory space of a four-by-four bit plane is selected by signals of the high-order bits of the address signal. In the thus selected memory space, single pixel information PIX (FIG. 2) is selected by the signals $A_0$ and $A_1$ of the low-order two bits of the address signal, and pixel information is written into and read out of a block.

In the plane mode, the memory chips 401 to 416 are selected four by four in the direction of plane when the signals $A_0$ and $A_1$ of the low-order two bits step to "0, 0", "1, 0", "0, 1", "1, 1", . . . . That is, when the signals $A_0$ and $A_1$ are "0, 0", the plane decoder 502C outputs an H-logic signal at its output terminal $Q_0$. The H-logic signal is applied to the first OR gates $OR_1$ of the OR gate groups 502D, 502E, 502F and 502G. As a result of this, the first OR gates $OR_1$ of the OR gate groups 502D to 502G provide H-logic chip select signals to the chip select terminals CS of the memory chips 401, 405, 409 and 413, and consequently, these memory chips are accessed.

When the signals $A_0$ and $A_1$ step to "1, 0", the plane decoder 502C provides an H-logic signal at its output terminal $Q_1$. The H-logic signal is applied to the second OR gates $OR_2$ of the OR gate groups 502D to 502G, from which H-logic chip select signals are applied to the chip select terminals CS of the memory chips 402, 406, 410 and 414, and consequently, these memory chips are accessed. When the signals $A_0$ and $A_1$ step to "0, 1", the plane decoder 502C provides an H-logic signal at its output terminal $Q_2$, which is applied to the third OR gates $OR_3$ of the OR gate groups 502D to 502G, from which H-logic chip select signals are applied to the chip select terminals CS of the memory chips 403, 407, 411 and 415, and consequently, these memory chips are accessed.

When the signals $A_0$ and $A_1$ step to "1, 1", the plane decoder 502C provides an H-logic signal at its output terminal $Q_3$. The H-logic signal is applied via the fourth OR gates $OR_4$ of the OR gate groups 502D to 502G to the chip select terminals CS of the memory chips 404, 408, 412 and 416, and consequently, these memory chips are accessed. Thus, in the plane mode the memory chips are accessed in groups of four chips, i.e. (401, 405, 409, 413), (402, 406, 410, 414), (403, 407, 411, 415) and (404, 408, 412, 416), and the plane information PLN (FIG. 2) can be written and read out in groups of 4 bits.

When the block mode select signal BLK is provided from the mode selector 503, this H-logic signal is applied to all of the OR gates. In this case, the memory chips 401 to 416 are all accessed at one time.

The arrangement of the chip selector 502 and its mode select operation can be understood from the above description.

Figure 6:
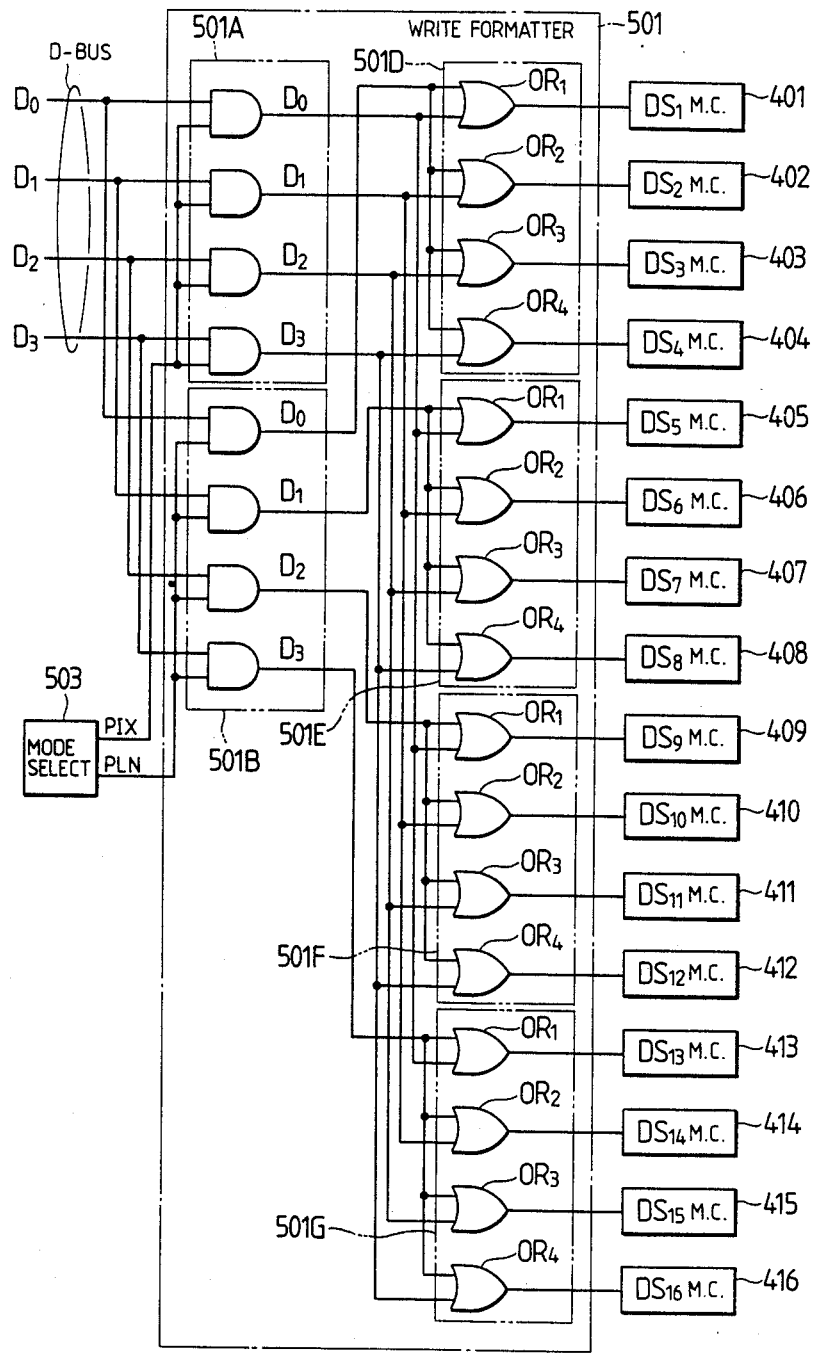
FIG. 6 is a connection diagram, for explaining an example of a write formatter for use in the present invention.

Next, the write formatter 501 will be described with reference to FIG. 6, which shows only the circuit arrangements necessary for the pixel and plane modes. As is the case with the chip selector 502, the write formatter 501 also has four OR gate groups 501D, 501E, 501F and 501G, to which data $D_0$ to $D_3$ are provided from AND gate groups 501A and 501B.

In the pixel mode, the AND gate group 501A is controlled by the mode signal PIX to provide the data $D_0$ to $D_3$ to OR gates $OR_1$ to $OR_3$ of the OR gate groups 501D to 501G. That is to say, the AND gate group 501A provides the data $D_0$ to the first OR gates $OR_1$, the data $D_1$ to the second OR gates $OR_2$, the data $D_2$ to the third OR gates $OR_3$ and the data $D_3$ to the fourth OR gates $OR_4$ of the OR gate groups 501D to 501G. In this way, the data $E_0$ to $D_3$ are written into the memory chips selected by the chip selector 502. The direction in which this data is written is a pixel direction.

In the plane mode, the AND gate group 501B is enabled by the mode signal PLN and provides data $D_0$ to the OR gates $OR_1$ to $OR_4$ of the first OR gate group 501D, data $D_1$ to the OR gates $OR_1$ to $OR_4$ of the second OR gate group 501E, data $D_2$ to the OR gates $OR_1$ to $OR_4$ of the third gate group 501F and data $D_3$ to the OR gates $OR_1$ to $OR_4$ of the fourth gate group 501G. In this way, any one of the single color data $D_0$, $D_1$, $D_2$ and $D_3$ is written into a set of memory chips selected by the chip selector 502, that is, any one of the memory chip groups 401 to 404, 405 to 408, 409 to 412 and 413 to 416. The direction in which the above data is written is a plane direction.

The memory access operation in the pixel and plane modes will be understood from the above description. Next, the arrangement of the write formatter 501 for operation in the block mode will be described.

Figure 7:
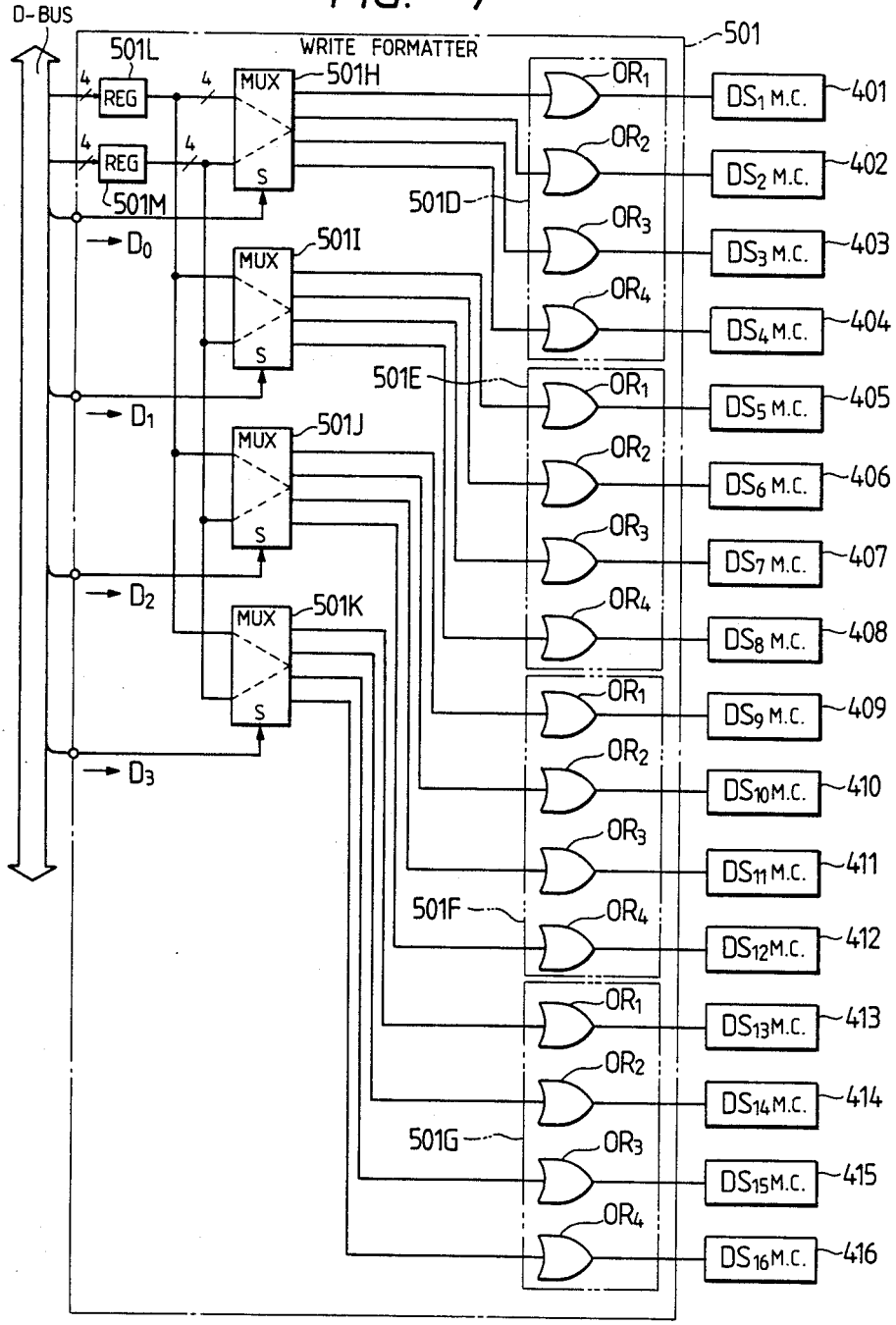
FIG. 7 is a connection diagram, for explaining an example of a write formatter which operates during the block mode.

For operation in the block mode, as shown in FIG. 7, the write formatter 501 is provided with two registers 501L and 501M and four multiplexers 501H, 501I, 501J and 501K. The registers 501L and 501M have preset therein 4-bit data through the data bus D-BUS. Data $D_0$ to $D_3$ are applied to control terminals S of the multiplexers 501H to 501L, respectively. When the data supplied to the control terminal S is H-logic, each multiplexer selects and outputs the 4-bit data stored in the register 501L. When the data supplied to the control terminal S is L-logic, each multiplexer selects and outputs the 4-bit data stored in the register 501M.

The 4-bit data from the multiplexer 501H is provided to the OR gates $OR_1$ to $OR_4$ of the OR gate group 501D, from which it is provided to data input terminals $DS_1$, $DS_2$, $DS_3$ and $DS_4$ of the memory chips 401, 402, 403 and 404. The 4-bit data from the multiplexer 501I is applied to the OR gates $OR_1$ to $OR_4$ of the OR gate group 501E, from which it is provided to data input terminals $DS_5$, $DS_6$, $DS_7$ and $DS_8$ of the memory chips 405, 406, 407 and 408. When the 4-bit data from the multiplexer 501J is applied to the OR gates $OR_1$ to $OR_4$ of the OR gate group 501F, from which it is provided to data input terminals $DS_9$, $DS_{10}$, $DS_{11}$ and $DS_{12}$ of the memory chips 409, 410, 411 and 412. The 4-bit data from the multiplexer 501K is provided to the OR gates $OR_1$ to $OR_4$ of the OR gate group 501G, from which it is provided to data input terminals $DS_{13}$, $DS_{14}$, $DS_{15}$ and $DS_{16}$.

The data which is stored in the registers 501L and 501M is supplied via the data bus D-BUS from the pattern generator 100 shown in FIG. 3. That is to say, there are provided also in the memory under test 200 facilities corresponding to the registers 501L and 501M and the multiplexers 501H to 501K, and in the block mode the data stored in one of the two registers is written in the memory chips in accordance with the logical values of the data $D_0$ to $D_3$. Consequently, by selecting and writing the data stored in one of the two registers 501L and 501M in accordance with the logical values of the data $D_0$ to $D_3$ also in the buffer memory 400, the same data as in the memory under test 200 can be written in all of the 16 memory cells 401 to 416. By reading the written data, expected value data in the block mode can be obtained.

Figure 8:
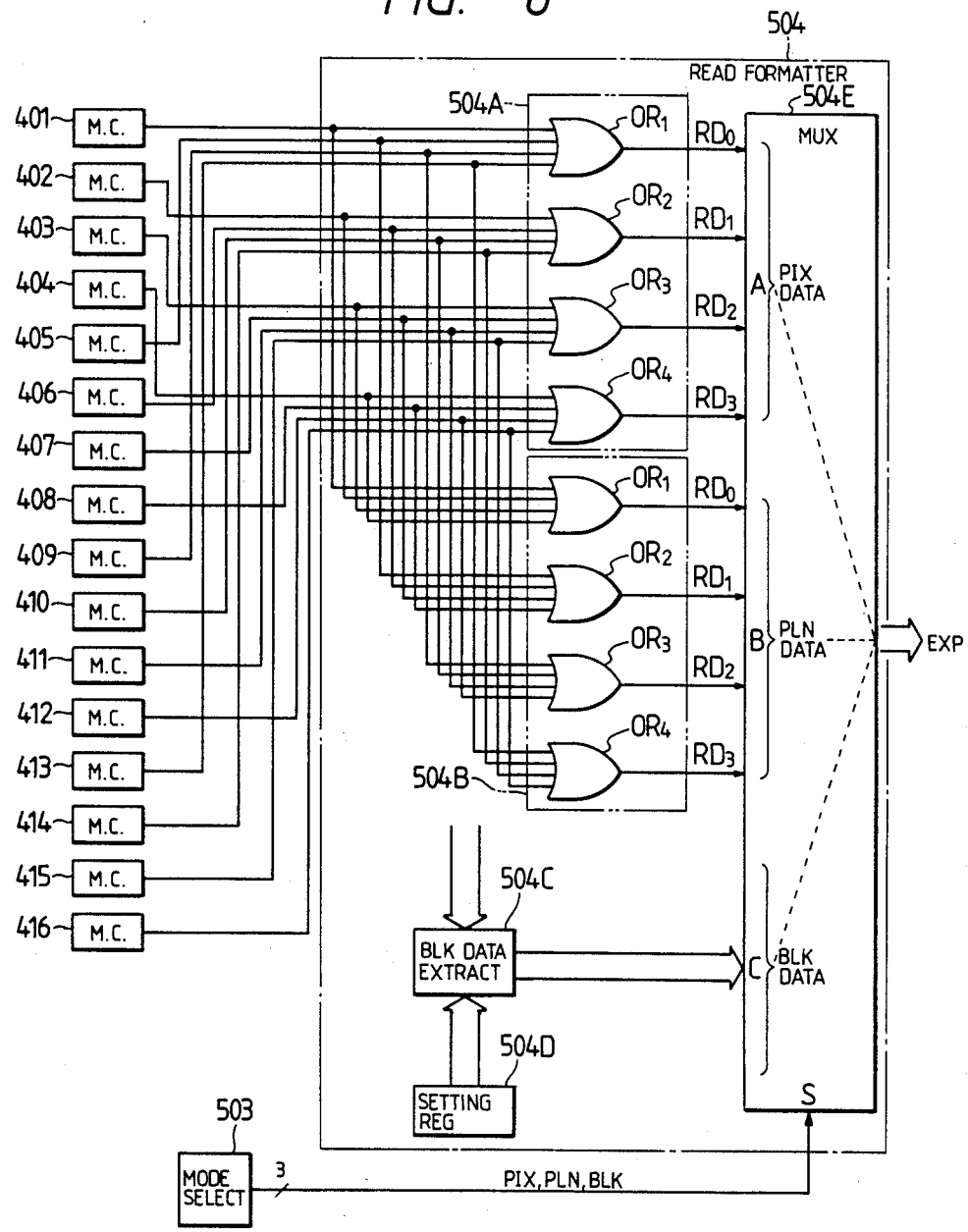
FIG. 8 is a connection diagram, for explaining an example of a read formatter for use in the present invention.

Turning next to FIG. 8, the read formatter 504 will be described. The read formatter 504 can be formed by, for instance, a pixel data extracting section 504A, a plane data extracting section 504B, a block data extracting section 504C, a setting register 504D and a multiplexer 504E.

The pixel data extracting section 504A can be formed by, for example, four OR gates $OR_1$ to $OR_4$. The OR gate $OR_1$ extracts signals read out of the memory chips 401, 405, 409 and 413. The OR gate $OR_2$ extracts signals read out of the memory chips 402, 406, 410 and 414. The OR gate $OR_3$ extracts signals read out of the memory chips 403, 407, 411 and 415. The OR gate $OR_4$ extracts signals read out of the memory chips 404, 408, 412 and 416.

With such an arrangement, when the memory chips 401 to 404, 405 to 408, 409 to 412 and 413 to 418 are sequentially selected in the pixel mode by the chip selector 502 depicted in FIG. 5, pixel data of four bits ($RD_0$, $RD_1$, $RD_2$, $RD_3$) is sequentially output from the pixel data extracting section 504A in FIG. 8. This pixel data is supplied to one input terminal A of the multiplexer 504E.

The plane data extracting section 504B can also be formed by four OR gates $OR_1$ to $OR_4$. The OR gate $OR_1$ extracts signals read out of the memory chips 401, 402, 403 and 404. The OR gate $OR_2$ extracts signals read out of the memory chips 405, 406, 407 and 408. The OR gate $OR_3$ extract signals read out of the memory chips 409, 410, 411 and 412. The OR gate $OR_4$ extracts signals read out of the memory chips 413, 414, 415 and 416.

With such an arrangement, when the memory chips are sequentially selected, by the chip selector 502 depicted in FIG. 5, in the order of 401, 405, 409, 413–402, 406, 410, 414–403, 407, 411, 415–404, 408, 412, 416, 4-bit ($RD_0$, $RD_1$, $RD_2$, $RD_3$) plane data is sequentially output from the plane data extracting section in FIG. 8. This plane data is supplied to an input terminal B of the multiplexer 504E.

In the block data extracting section 504C described below, the read outputs of the memory chips 401 to 416 are each compared with a value preset in the setting register 504D, and in accordance with their agreement or disagreement, the logical values of the data $D_0$ to $D_3$ are determined, and this logical output is provided as block data to an input terminal C of the multiplexer 504E.

Figure 9:
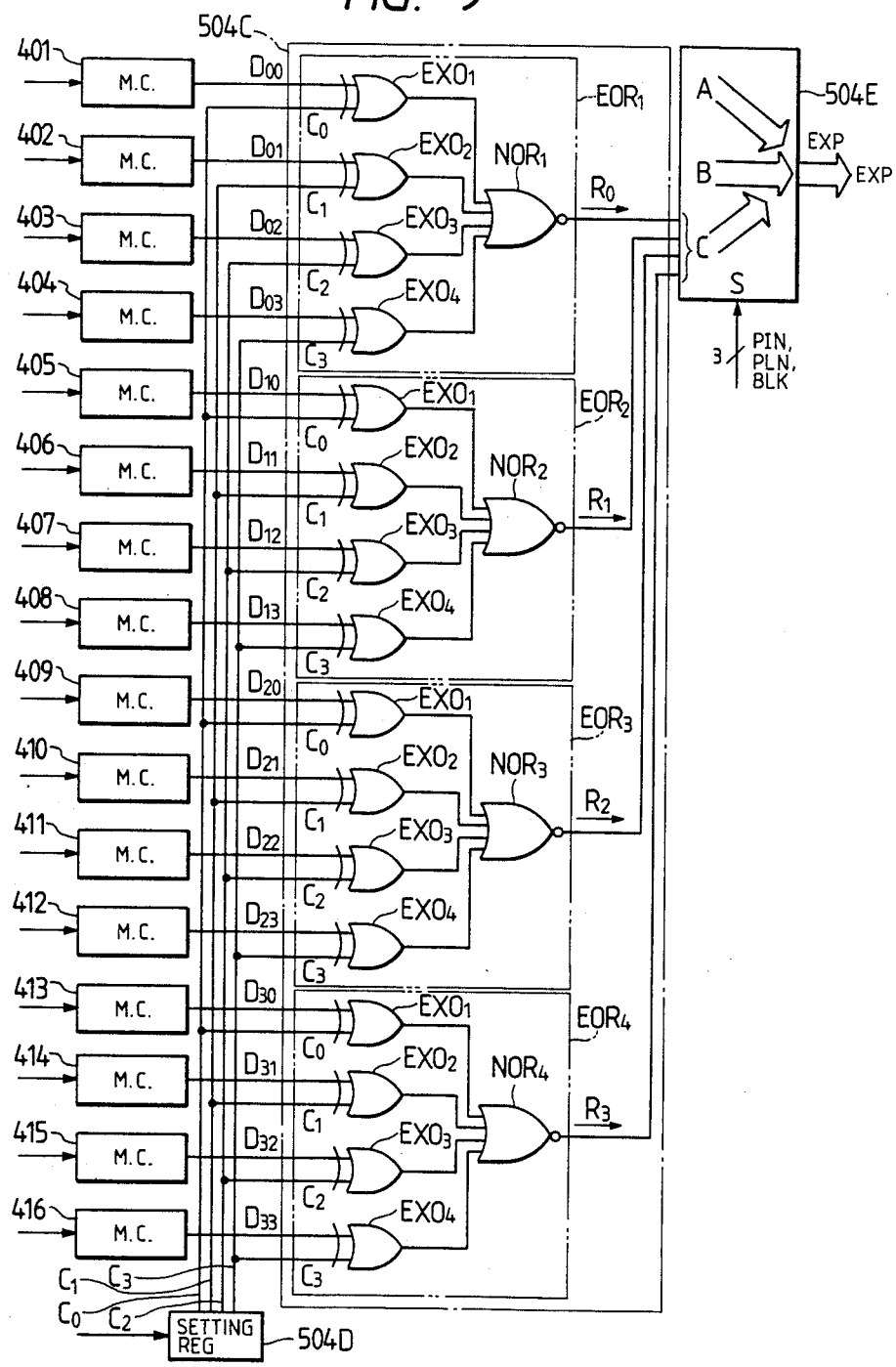
FIG. 9 is a connection diagram, for explaining an example of expected value data extracting means in the block mode for use in the present invention.

Referring now to FIG. 9, the arrangement and operation of the block data extracting section 504C will be described. The block data extracting section 504C has four exclusive OR circuit groups $EOR_1$, $EOR_2$, $EOR_3$ and $EOR_4$ so as to perform the same operation as that of the memory under test 200 in the block mode. The exclusive OR circuit groups $EOR_1$ to $EOR_4$ are each made up of four exclusive OR circuits $EXO_1$, $EXO_2$, $EXO_3$ and $EXO_4$ for comparing read outputs $D_{00}$ to $D_{33}$ of the memory chips 401 to 416 and set values $C_0$ to $C_3$ stored in the setting register 504D, and NOR circuits $NOR_1$, $NOR_2$, $NOR_3$ and $NOR_4$ for obtaining NOR's of the four exclusive OR circuits $EXO_1$, $EXO_2$, $EXO_3$ and $EXO_4$.

In the block mode all the memory chips 401 to 416 are selected as shown in FIG. 5. Consequently, for example, when the data $D_{00}$ to $D_{03}$ read out of the memory chips 401 to 404 and the set values $C_0$ to $C_3$ stored in the setting register 504D agree with each other, the output signal $R_0$ of the first exclusive OR circuit group $EOR_1$ goes to a "1", and when even one piece of the data disagrees, the output signal $R_0$ goes to a "0". The other exclusive OR circuit groups $EOR_2$, $EOR_3$ and $EOR_4$ also operate in the same manner as mentioned above and yield output signals $R_1$, $R_2$ and $R_3$, respectively. The output signals $R_0$ to $R_3$ are applied to the input terminal C of the multiplexer 504E, wherein in the block mode they are selected and provided as expected value data to the logical comparator 300.

Figure 10:
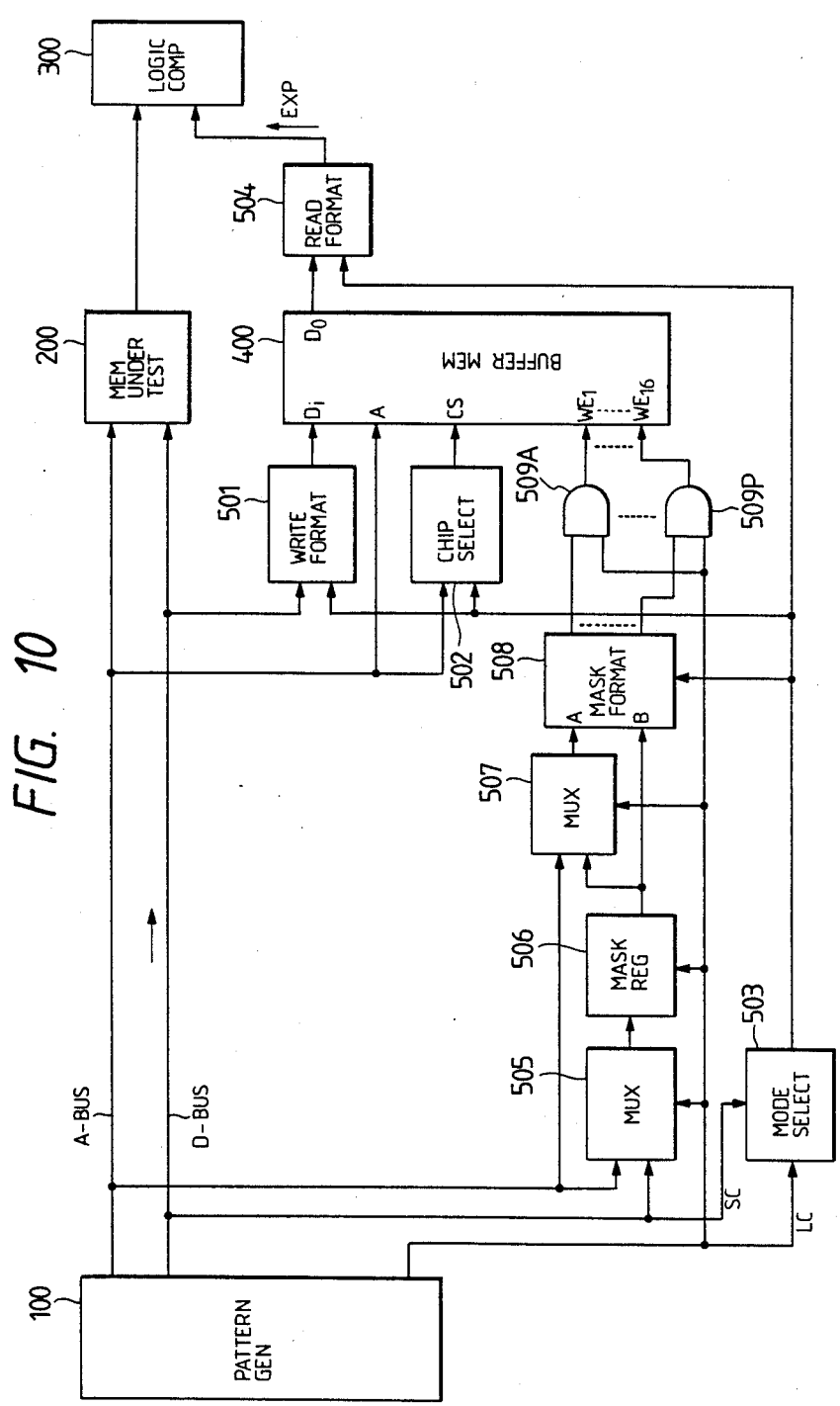
FIG. 10 is a block diagram illustrating an embodiment of the present invention.

FIG. 10 illustrates an embodiment for furnishing the buffer memory 400 with a mask function. Reference numeral 505 indicates a multiplexer, through which mask data provided via either one of the address bus A-BUS and the data bus D-BUS is passed on to a mask register 506. That is, the mask data is sent over the address bus or data bus depending on the standard of the memory under test 200. The mask data thus sent via the address bus or data bus is loaded in the mask register 506.

According to the standard of the memory under test 200 it is determined whether to use the mask data sent via the address bus A-BUS or the mask data stored in the mask register 506. A multiplexer 507 is provided for this selection. The mask data selected by the multiplexer 507 and the mask data stored in the mask register 506 are provided to a mask formatter 508. The mask formatter 508 defines the bit positions to be masked according to the modes and selectively enables and disables AND gates 509A to 509P, placing them in masked and unmasked states. In accordance with the enabled and disabled states of the AND gates 509A to 509P a write command signal from the pattern generator 100 passes through the respective gates and are applied to write enable terminals WE of the respective chips of the buffer memory 400, placing them into a write or masked state.

Figure 11:
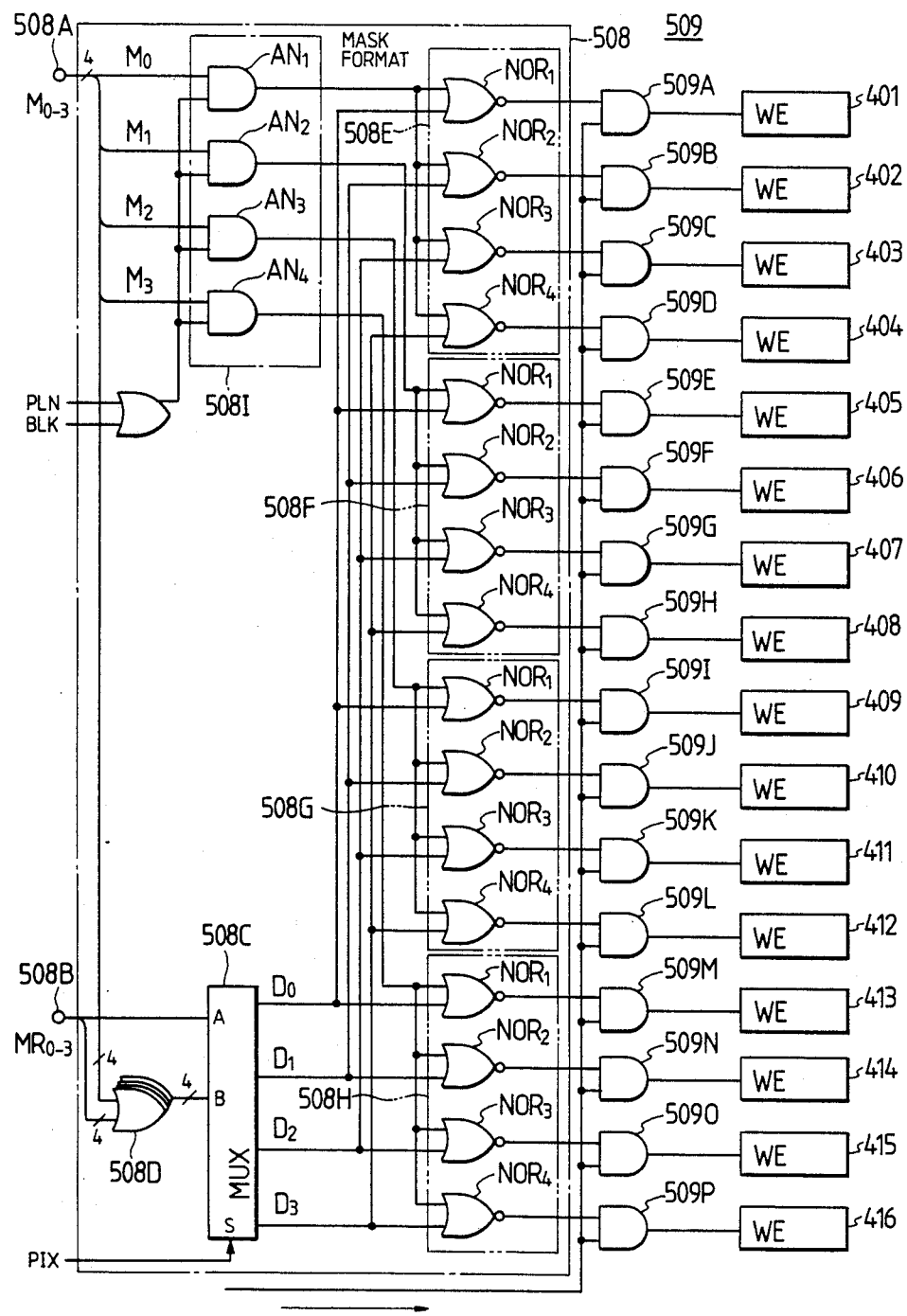
FIG. 11 is a connection diagram, for explaining a concrete circuit arrangement of a mask formatter which forms the principal part of the present invention.

FIG. 11 illustrates the internal structure of the mask formatter 508. Its input terminal 508A is supplied with mask data $M_0$, $M_1$, $M_2$ and $M_3$ selected by the multiplexer 507, and an input terminal 508B is supplied with mask data $MR_0$, $MR_1$, $MR_2$ and $MR_3$ stored in the mask register 506. The mask data $M_0$ to $M_3$ applied to the input terminal 508A are input into an AND gate group 508I. The mask data $MR_0$ to $MR_3$ applied to the input terminal 508B are ORed with the mask data $M_0$ to $M_3$ in OR gates 508D, and their outputs are applied to an input terminal B of a multiplexer 508C. In the pixel mode the multiplexer 508C selects the input terminal B and supplies NOR gates $NOR_1$ to $NOR_4$ of OR gate groups 508E, 508F, 508G and 508H with data $D_0$, $D_1$, $D_2$ and $D_3$ obtained by ORing the mask data provided to the input terminals 508A and 508B. In other words, data $D_0$ of 4-bit data $D_0$ to $D_3$ is provided to first NOR gates $NOR_1$ of the NOR gate groups 508E to 508H, data $D_1$ to second NOR gates $NOR_2$ of the NOR gate groups 508E to 508H, data $D_2$ to third NOR gates $NOR_3$ of the NOR gate groups 508E to 508H, and data $D_3$ to fourth NOR gates $NOR_4$ of the NOR gate groups 508E to 508H.

In the plane and block modes the multiplexer 508C selects an input terminal A and provides the mask data $MR_0$ to $MR_3$, applied to the input terminal 508E, to the NOR gate groups 508E to 508H. At the same time, the mask data $M_0$ to $M_3$ are provided to four AND gates $AN_1$, $AN_2$, $AN_3$ and $AN_4$ which form the AND gate group 508I. In the plane and block modes the AND gates $AN_1$ to $AN_4$ are enabled, permitting the passage therethrough of the mask data $M_0$ to $M_3$.

The output of the AND gate $AN_1$ is applied to all the NOR gates $NOR_1$ to $NOR_4$ of the NOR gate group 508E. The output of the AND gate $AN_2$ is applied to all the NOR gates $NOR_1$ to $NOR_4$ of the NOR gate group 508F. The output of the AND gate $AN_3$ is applied to all the NOR gates of the NOR gate group 508G. The output of the AND gate $AN_4$ is applied to all the NOR gates $NOR_1$ to $NOR_4$ of the NOR gate group 508H.

Thus, in the plane and block modes, the input mask data $M_0$ to $M_3$ provided from the AND gate group 508I and the mask data $MR_0$ to $MR_3$ stored in the mask register 506 and provided through the multiplexer 508C are NORed by the NOR gates $NOR_1$ to $NOR_4$, thereby ensuring normal masking in the plane and block modes.

Figure 12A:
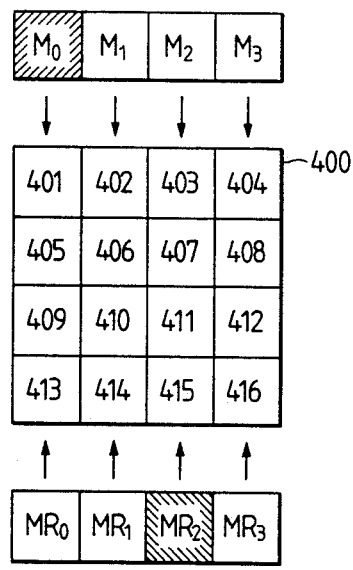
FIGS. 12A and 12B are diagrams, for explaining in the pixel mode the operation of the mask formatter depicted in FIG. 11.
Figure 12B:
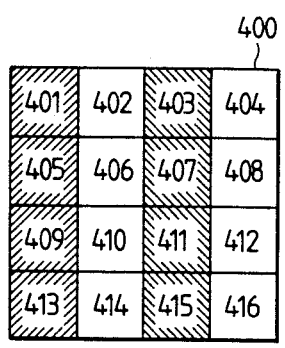

In the pixel mode, assuming that the data $M_0$ in the input mask data $M_0$ to $M_3$ and the data $MR_2$ in the mask data $MR_0$ to $MR_3$ stored in the mask register 506 are set to the H-logic and specified for masking as shown in FIG. 12A, corresponding portions of these mask data are ORed in the OR gate group 508D, and as a result, the output $D_0$ and $D_2$ of the multiplexer 508C go H-logic and the NOR gates $NOR_1$ and $NOR_3$ of the NOR gate groups 508E to 508H yield H-logic data, by which the AND gates 509A, 509C, 509E, 509G, 509I, 509M and 509O are disabled. In consequence, the memory chips 401, 405, 409, 413 and 403, 407, 411, 415 are masked as indicated by hatching in FIG. 12B, and inhibited from re-writing data.

In the plane and block modes, the mask data $MR_0$ to $MR_3$ are provided from the multiplexer 508C and the input mask data $M_0$ to $M_3$ are provided from the AND gate group 508I. These mask data $M_0$ to $M_3$ and $MR_0$ to $MR_3$ are NORed in the NOR gate groups 508E to 508H.

Figure 13A:
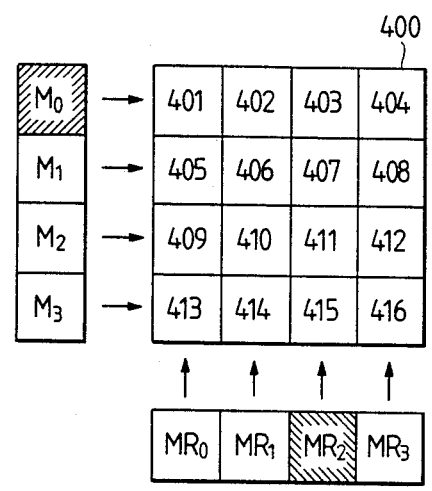
FIGS. 13A and 13B are diagrams, for explaining in the plane and block modes the operation of the mask formatter depicted in FIG. 11.
Figure 13B:
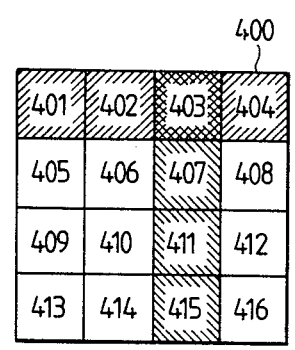

Now, let it be assumed that the data $M_0$ in the input mask data $M_0$ to $M_3$ and the data $MR_2$ in the mask data $MR_0$ to $MR_3$ are set to the H-logic and specified for masking as shown in FIG. 13A. In this case, L-logic signals are output from all the NOR gates $NOR_1$ to $NOR_4$ of the NOR gate group 508E and the NOR gates $NOR_3$ of the NOR gate groups 508E to 508H. The L-logic signals disable the AND gates 509A to 509D, 509G, 509K and 509O, and consequently, the memory chips 401, 402, 403, 404 and 407, 411, 415 are masked as indicated by hatching in FIG. 13B and are inhibited from re-writing data. As is evident from FIGS. 13A and 13B, masking in the plane and block modes can be achieved by a common circuit arrangement.

Figure 14:
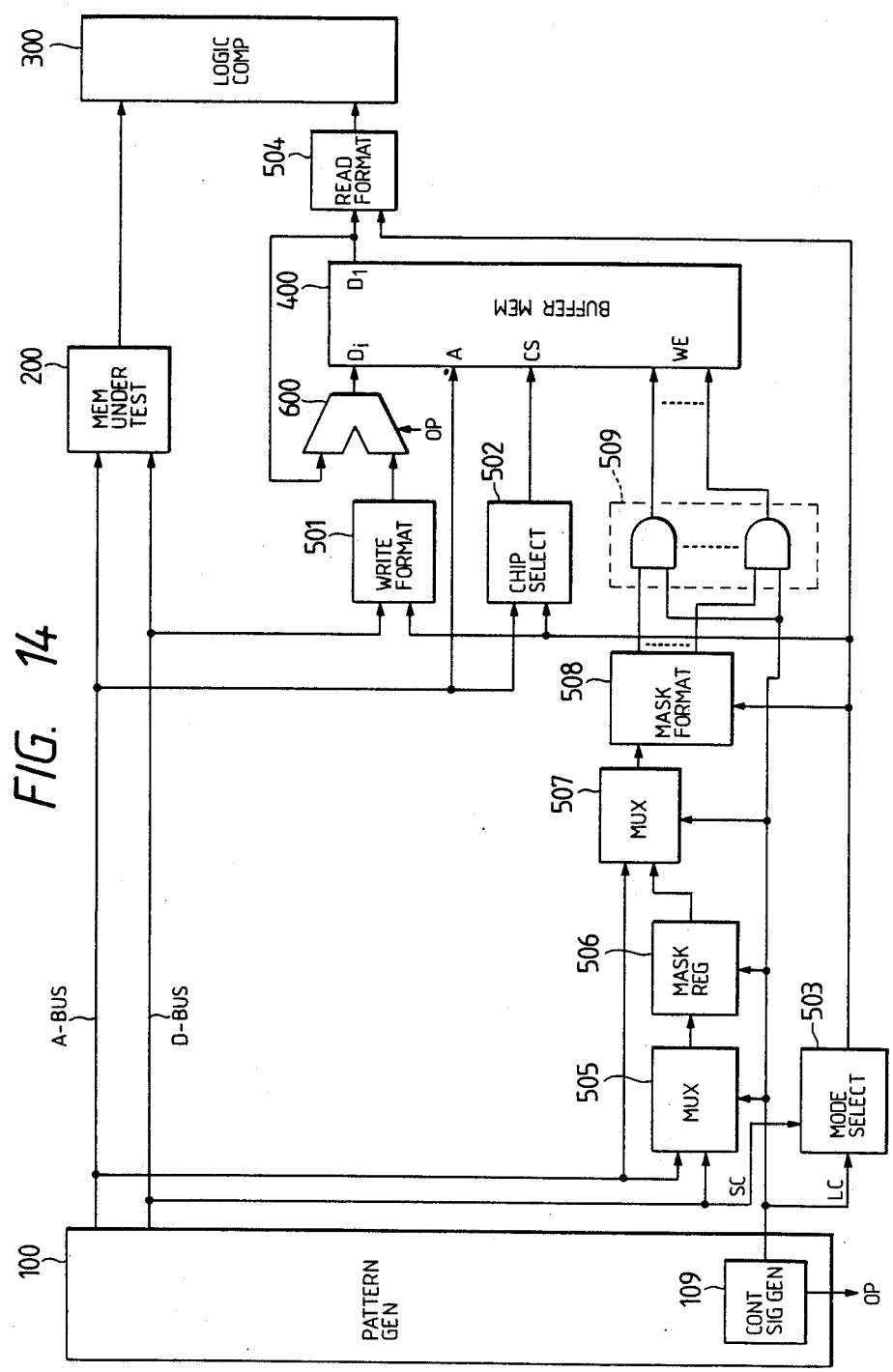
FIG. 14 is a block diagram illustrating another embodiment of the present invention.

FIG. 14 illustrates another embodiment of the present invention, in which a logical operation section 600 is provided between the data input terminal $D_i$ of the buffer memory 400 and the write formatter 501. Data from the pattern generator 100 is input via the write formatter 501 into one input terminal of the logical operation section 600, which is supplied at the other input terminal with read-out data of the buffer memory 400. The results of operation are written into the buffer memory 400. The memory under test 200 and the buffer memory 400 are supplied with the same address signal from the pattern generator 100 via the address bus A-BUS. The data created by the pattern generator 100 is provided via the data bus D-BUS to the memory under test 200 and the logical operation section 600.

That portion contained in the address signal provided on the address bus A-BUS which sets the operation mode of a logical operation section built in the memory under test 200 is also provided as operation mode setting data to the logical operation section 600. Consequently, exactly the same operation as that for a data write in the memory under test 200 is performed in the logical operation section 600, and the results of operation are written into the buffer memory 400. It is controlled by a signal OP from a control signal generator 109 whether or not the operation is performed in the logical operation section 600.

By such an operation the contents of the memory under test 200 and the contents of the buffer memory 400 are always in agreement with each other. It is therefore possible to determine whether the memory under test 200 is good or bad by accessing the memory 200 and the buffer memory 400 by the same address and comparing their read-out data in the logical comparator 300. Incidentally, the load command LC for loading the mode select code SC into the mode selector 503 from the data bus D-BUS is also created by the control signal generator 109, though not described in the above.

Next, a description will be given, with reference to FIG. 15, of an example of testing a memory provided with the random access port and the serial access port.

Figure 15:
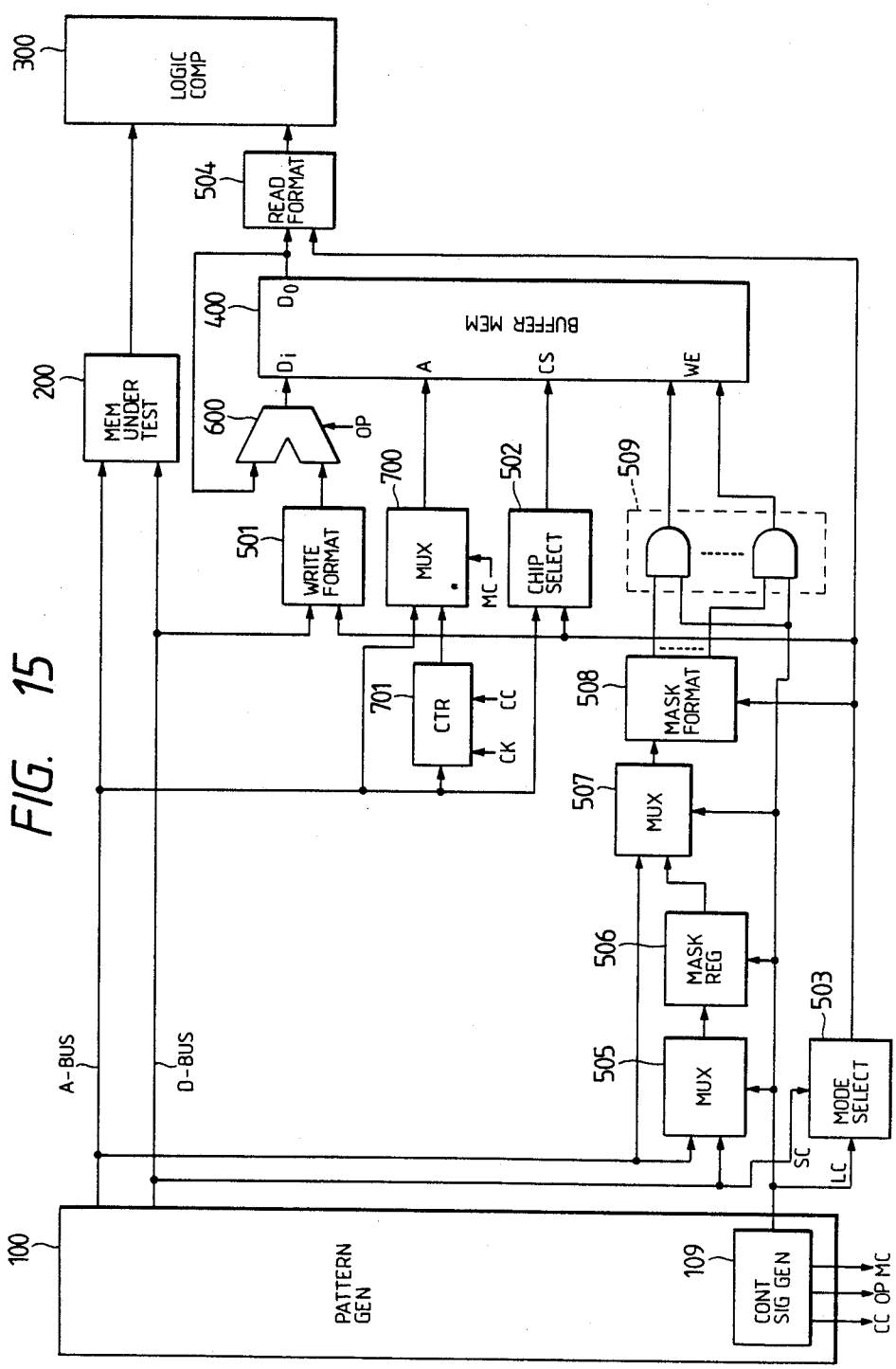
FIG. 15 is a block diagram illustrating another embodiment of the present invention.

In FIG. 15, a two-input multiplexer 700 is connected in series with the address input terminal A of the buffer memory 400 and a counter 701 is connected to one input of the multiplexer 700. The counter 701 has a function of loading an address created by the pattern generator 100 and a function of incrementing (by one), decrementing (by one) and holding the value of the counter 701. The multiplexer 700 selects whether the address to be applied to the buffer memory 400 is the address produced by the pattern generator 100 or the count value of the counter 701.

The counter 701 is controlled by a counter control signal CC which is produced by the control signal generator 109 of the pattern generator 100. The switching of the multiplexer 700 is also controlled by a multiplexer control signal MC which is generated by the control signal generator 109.

In the memory equipped with the random access port and the serial access port, its SAM (Serial Access Memory) section is accessed by a pointer. The initialization of the point is performed using an address which is provided from outside, and the initial value is set in the counter 701.

The address and data from the pattern generator 100 are provided to a RAM (Random Access Memory) section of the memory under test 200, and at the same time, the address is provided via the multiplexer 700 to the buffer memory 400 to access it for writing therein the data. Thereafter data in the RAM section of the memory under test 200 is transferred to the SAM section and the pointer of the SAM section of the memory under test 200 is initialized using an address signal from the pattern generator 100. At the same time, the counter 701 is initialized by the same address signal and the buffer memory 400 is accessed and read by the counter 701. Then the data read out of the SAM section of the memory under test 200 in synchronization with the readout of the buffer memory 400 and the read-out data from the latter are subjected to logical comparison. Thus, the memory under test 200 can be tested.

As described above, according to the present invention, the buffer memory 400 is made up of the plurality of memory chips 401 to 416, which can be accessed by the chip selector 502 for write and read in each of the pixel, plane and block modes. This enables the buffer memory 400 to perform the write/read operation equivalent to that of the memory under test 200. For example, data written in the pixel mode can be read out in the plane or block mode in accordance with the mode in the memory under test 200. Similarly, it is possible to write data in the plane mode and read it out in the pixel or block mode and to write data and read it out in the block mode. Thus, the buffer memory 400 can be enabled to perform an operation equivalent to that of the memory under test 200, and consequently, expected value data of the memory under test 200 can be obtained. By using, as the chips 401 to 416, nondefective memory chips higher in operation speed than the memory under test 200, data written in the memory 200 can be obtained from the buffer memory 400 faster than the read output of the memory 200. The data thus read out of the buffer memory 400 can therefore be used as expected value data, and error-free expected value data can easily be obtained regardless of the mode of operation of the memory under test 200.

According to the present invention, memories with logical operation functions can also be tested. This does not call for a complicated program for the expected value generating section of the pattern generator 100, and hence affords reduction of manufacturing costs of the memory testing device. Further, memories memory with random and serial access ports can also be tested.

While in the above the number of bits of data in the pixel and plane modes has been described to be four, it will be understood that the present invention is not limited specifically to this number of bits.

It will be apparent that many modifications and variations may be effected without departing from the scope of the novel concepts of the present invention.

What is claimed is:

1. A memory testing device for testing a memory capable of effecting a write operation and a read operation in a pixel mode, a plane mode and a block mode, comprising:
    pattern generating means for generating an address and data for supply to the memory under test;
    buffer memory means which, letting the number of bits to be written in and read out of each address of the memory under test be represented by W, has $W^2$ individual memory chips which define a matrix with W rows and W columns;
    mode select means for generating a mode select signal for selecting and specifying the same mode as used in the memory under test for each of write and read operations;
    chip select means, responsive to the mode select signal, for selecting the memory chips so that data generated by said pattern generating means is written in said buffer memory means in the same mode as used in the memory under test and so that data stored in said buffer memory means is read out in the same mode as used in the memory under test;
    write format means responsive to the mode select signal from said mode select means, for writing the same data as in the memory under test into said buffer memory means in the same mode as in the memory under test;

read format means responsive to the mode select signal, for reading said buffer memory means in the same mode as in the memory under test; and logical comparison means which receives, as expected value data, the data output from said read format means, for comparing the data output from said read format means with data read out of the memory under test.

2. The memory testing device of claim 1, further comprising mask means for inhibiting an arbitrary bit of data to be written in said buffer memory means in the mode selected by said mode select means.

3. The memory testing means of claim 2, wherein said mask means includes:

mask register means for storing fixed mask data supplied in advance from said pattern generating means;

multiplexer means for selecting either one of the fixed mask data of said mask register means and a mask pattern provided from said pattern generating means; and mask format means wherein, in the pixel mode, the OR of the output of said multiplexer means and the mask pattern from said pattern generating means are provided to write enable terminals of the memory chips of each row and, in the plane mode and the block mode, the output of said multiplexer means is applied to the write enable terminals of the memory chips and the mask pattern from said pattern generating means is provided to the write enable terminals of the memory chips of each row.

4. The memory testing device of claim 2, wherein said write format means includes logical operation means for performing a logical operation for each bit of input data from said pattern generating means and writing the results of the logical operation in said buffer memory means.

5. The memory testing device of claim 2, further comprising:

counter means for presetting therein an arbitrary address provided from said pattern generating means and incrementing or decrementing the preset arbitrary address; and multiplexer means for selectively providing an address generated by said pattern generating means and the contents of said counter means as an address to said buffer memory means.

6. The memory testing device of claim 2, wherein the number of bits, W, of the data is equal to $2^m$, where m is an integer greater than unity, and wherein said chip select means includes:

decode means which is enabled by the mode select signal from said mode select means, for decoding low-order m bits of the address from said pattern generating means; and a plurality of OR gate groups which respond to the decoded output of said decode means to apply chip select signals to predetermined rows of said $W \times W$ memory chips in the pixel mode and to predetermined columns of said memory chips in the plane mode.

7. The memory testing device of claim 2, wherein said write format means includes:

a plurality of OR gate groups which, in the pixel mode, provide the same W-bit data from said pattern generating means to data input terminals of said W memory chips of each row and, in the plane mode, provide the same W-bit data to data input terminals of said W memory chips of each column;

first and second registers for presetting first and second block data of W bits which are provided from said pattern generating means in the block mode; and W multiplexers, each of which is connected to both said first and second registers and selectively outputs the contents of said first and second registers in accordance with a logical value of a corresponding bit of the W bit data provided from said pattern generating means, the outputs of respective ones of said multiplexers being provided via the corresponding OR gate groups to data input terminals of said memory chips of the corresponding rows.

8. The memory testing device of claim 2, wherein said read format means includes:

a first OR gate group which outputs the OR of data read out of said W data memory chips of each column in the pixel mode;

a second OR gate group which outputs the OR of data read out of the W memory chips of each row in the plane mode; and multiplexer means which selectively outputs, as the expected value data, the output of either one of the first and second OR gate groups in accordance with the mode select signal from said mode select means.

9. The memory testing device of claim 1, wherein said write format means includes logical operation means for performing a logical operation for each bit of input data from said pattern generating means and writing the results of the logical operation in said buffer memory means.

10. The memory testing device of claim 1, further comprising:

counter means for presetting therein an arbitrary address provided from said pattern generating means and incrementing of decrementing the preset arbitrary address; and multiplexer means for selectively providing an address generated by said pattern generating means and the contents of said counter means as an address to said buffer memory means.

11. The memory testing device of claim 1, wherein the number of bits, W, of the data is equal to $2^m$, where m is an integer greater than unity, and wherein said chip select means includes:

decode means which is enabled by the mode select a signal from said mode select means, for decoding low-order m bits of the address from said pattern generating means; and a plurality of OR gate groups which respond to the decoded output of said decode means to apply chip select signals to predetermined rows of said $W \times W$ memory chips in the pixel mode and to predetermined columns of said memory chips in the plane mode.

12. The memory testing device of claim 1, wherein said write format means includes:

a plurality of OR gate groups which, in the pixel mode, provide the same W-bit data from said pattern generating means to data input terminals of said W memory chips of each row and, in the plane mode, provide the same W-bit data to data input terminals of said W memory chips of each column;

first and second registers for presetting first and second block data of W bits which are provided from said pattern generating means in the block mode; and W multiplexers, each of which is connected to both said first and second registers and selectively outputs the contents of said first and second registers in accordance with a logical value of a corresponding bit of the W bit data provided from said pattern generating means, the outputs of respective ones of said multiplexers being provided via the corresponding OR gate groups to data input terminals of said memory chips of the corresponding rows.

13. The memory testing device of claim 1, wherein said read format means includes:

a first OR gate group which outputs the OR of data read out of said W data memory chips of each column in the pixel mode;

a second OR gate group which outputs the OR of data read out of the W memory chips of each row in the plane mode; and multiplexer means which selectively outputs, as the expected value data, the output of either one of the first and second OR gate groups in accordance with the mode select signal from said mode select means.

14. The memory testing device of claim 13, wherein said read format means further includes:

a register for presetting therein W-bit data from said pattern generating means; and an agreement detecting circuit group which compares the W-bit data set in said register and W-bit data read out of the memory chips of each row and, when the corresponding bits are all in agreement, outputs a logic value of either one of the corresponding bits, the output of said agreement detecting circuit group being applied to said multiplexer means, and wherein said multiplexer means selectively outputs, as the expected value data, the output of one of said first and second OR gate groups and said agreement detecting circuit group in accordance with the mode select signal from said mode select means.

15. A memory testing device for testing a memory which is capable of performing read and write operations in a pixel mode, a plane mode and a block mode, comprising:

a pattern generator, coupled to the memory under test, for generating addresses and data which are supplied to the memory under test, and for generating a first mode select signal specifying the mode in use in the memory under test, the number of bits to be written in and read out of each address of the memory under test being W, where W is an integer;

a buffer memory having $W^2$ individual memory chips arranged in a matrix, for storing expected value data;

a mode selector, coupled to said pattern generator, for receiving the first mode select signal from said pattern generator, and for generating a corresponding second mode select signal;

a chip selector, coupled to said buffer memory and said mode selector, for selecting selected ones of said $W^2$ individual memory chips in accordance with the second mode select signal, so that data generated by said pattern generating means is written in said buffer memory as the expected value data in the same mode as used in the memory under test, and so that the expected value data stored in said buffer memory is read out in the same mode as used in the memory under test; and a logical comparator, coupled to the memory under test and said buffer memory, for comparing the data read out of the memory under test with the expected value data read out of said buffer memory.

* * * * *

UNITED STATES PATENT AND TRADEMARK OFFICE
CERTIFICATE OF CORRECTION

PATENT NO. : 4,958,345
DATED : SEPTEMBER 18, 1990
INVENTOR(S) : KENICHI FUJISAKI

It is certified that error appears in the above-identified patent and that said Letters Patent is hereby corrected as shown below:

Col. 10, line 36, "5090" should be --5090--;

line 53, "5090" should be --5090--.

Col. 14, line 41, "of" should be --or--.

Signed and Sealed this

Twelfth Day of March, 1991

*Attest:*

HARRY F. MANBECK, JR.

*Attesting Officer*    *Commissioner of Patents and Trademarks*